United States Patent [19]

Robinette, Jr. et al.

[11] Patent Number: 5,456,404
[45] Date of Patent: Oct. 10, 1995

[54] METHOD OF TESTING SEMICONDUCTOR CHIPS WITH REUSABLE TEST PACKAGE

[75] Inventors: William C. Robinette, Jr., Los Altos Hills; Chung W. Ho, Monte Sereno, both of Calif.

[73] Assignee: Digital Equipment Corporation, Maynard, Mass.

[21] Appl. No.: 144,844

[22] Filed: Oct. 28, 1993

[51] Int. Cl.⁶ .................................................. H01L 21/66
[52] U.S. Cl. .................... 228/104; 228/116; 228/180.22; 324/754
[58] Field of Search ................................. 228/104, 116, 228/180.22; 324/754, 757

[56] References Cited

U.S. PATENT DOCUMENTS

| | | | |
|---|---|---|---|
| 4,554,505 | 11/1985 | Zachry | 324/755 |
| 4,733,172 | 3/1988 | Smolley | 324/754 |
| 4,804,132 | 2/1989 | DiFrancesco | 228/115 |
| 4,808,132 | 2/1989 | DiFrancesco | 228/116 X |
| 4,814,040 | 3/1989 | Ozawa | 29/846 X |
| 4,859,189 | 8/1989 | Peterson et al. | 439/66 |
| 4,870,356 | 9/1989 | Tingley et al. | 324/754 |
| 4,899,107 | 2/1990 | Corbett et al. | 324/758 |
| 4,948,645 | 8/1990 | Holzinger et al. | 428/137 |
| 4,972,143 | 11/1990 | Kamensky et al. | 324/754 |
| 4,975,638 | 12/1990 | Evans et al. | 324/754 |
| 4,980,636 | 12/1990 | Romanofsky et al. | 324/754 |
| 5,006,792 | 4/1991 | Malhi et al. | 324/762 |
| 5,007,163 | 4/1991 | Pope et al. | 228/180.21 |
| 5,007,576 | 4/1991 | Congleton et al. | 228/103 |
| 5,012,187 | 4/1991 | Littlebury | 324/754 |
| 5,054,680 | 10/1991 | Stockham | 228/104 |
| 5,083,697 | 1/1992 | Difrancesco et al. | 228/116 |

*Primary Examiner*—Kenneth J. Ramsey
*Attorney, Agent, or Firm*—Arthur W. Fisher; Rama B. Nath

[57] ABSTRACT

A method for testing semiconductor chips using a test package having electrical contacts which have in them metallized particles which pierce the surface of the pads of a semiconductor chip, the chips being mounted on a flexible substrate which can deflect to increase the uniformity of the level to which the metallized particles pierce the surface of the pads of the semiconductor chip. If the chip tests as "good", pressure can be applied to increase the piercing depth, thereby allowing the test package to be used as a permanent package.

12 Claims, 3 Drawing Sheets

METHOD OF TESTING SEMICONDUCTOR CHIPS WITH REUSABLE TEST PACKAGE

BACKGROUND OF THE INVENTION

This invention relates to methods for testing semiconductor chips. Semiconductor chips are typically manufactured on wafers, with several chips being fabricated on a single wafer. After the wafers are fabricated, they are first probed, then sawn into individual chips. The chips are then packaged and tested. If the test indicates a chip to be defective, the chip and package are discarded.

A problem with this testing and shipping procedure is that attaching the chip to the package is an expensive process; in addition, the chip package itself may be expensive. The probing step prevents some defective chips from being packaged, but probe testing is not satisfactory, because some defects are introduced in later steps, such as sawing or when the chip is packaged. Additionally, the chips cannot be tested "at speed," that is, under the conditions they will eventually be used, because the electrical connection between the test probe and the chip is inadequate for high speed testing.

Thus, a method for testing chips which allows the chip to be tested in its package, but which allows defective chips to be easily removed from the package in a manner that allows the package to be reused, is desirable.

Two related methods for forming temporary bonds are described in U.S. Pat. No. 4,804,132, issued Feb. 14, 1989 to DiFrancesco and U.S. Pat. No. 5,083,697 issued Jan. 28, 1992, also to DiFrancesco. In the methods disclosed in the DiFrancesco patents, a method for establishing electrical contacts of two surfaces in which one of the surfaces has metallized particles that protrude at the desired bonding point. The strength of the bond can be controlled by varying the size of the particles and the piercing depth.

For the methods disclosed in the DiFrancesco patents to work for chip testing, the piercing depth of the metallized particles must be precisely controlled. Insufficient piercing depth can mean that the electrical contact is insufficient for accurate testing, and excessive piercing depth can result in a bond being made unintentionally permanent, or damaging the contact pad or the underlying substrate. A semiconductor chip typically may have several hundred contact pads. The height of the contact pads may vary, and the semiconductor substrate may be slightly non-planar, which makes keeping the piercing depth for each of the pads within the desired range difficult. Additionally, the chip must be precisely aligned with the contact pads to allow "at speed" electrical testing. Thus, there is an additional need to align the chip to the pads in the test package.

SUMMARY OF THE INVENTION

The invention provides an semiconductor chip testing method which provides a test package with a flexible substrate. The flexible substrate allows for uniform piercing depth of the metallized particles because the use of multiple layers of thin film metal polymer films can provide compliance to compensate for height differences of the contact pads, thereby ensuring reliable contact. The chips can be tested in test package. Faulty chips can be removed from the test package, and the test package can then be reused. "Good" chips can either be easily removed from the test package and placed in a different chip package, or the bond can be made permanent.

In addition, the invention provides a photodefinable alignment template, or "fence" which can be formed on the substrate to aid in precisely aligning the chip.

If the bond is made permanent, the reliability of the packaged chip can be increased by covering the bond sites with an agent which prevents corrosive or oxidation causing gases from reaching the bonds sites.

The invention is more completely described in the detailed description of the invention, which will refer to the drawings described below, in which like numerals refer to like elements in the several views.

DETAILED DESCRIPTION OF THE INVENTION

Figure 1:
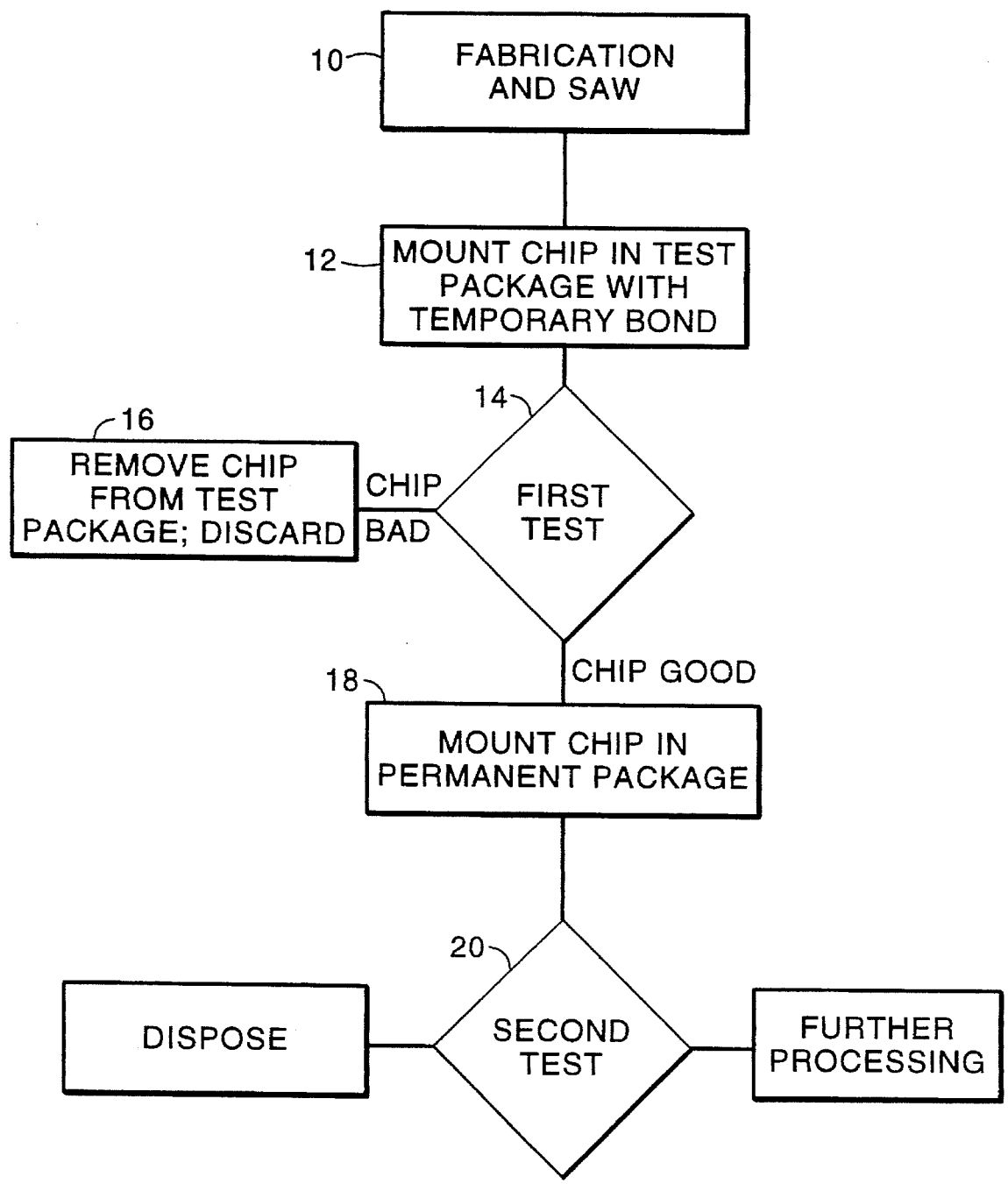
FIG. 1 is a flow diagram of a method for packaging and testing a semiconductor chip according to the invention.

FIG. 1 illustrates the process for packaging and testing a semiconductor chip according to the invention. In the fabrication step 10, semiconductor chips are fabricated on wafers and sawed into individual semiconductor chips according to methods known to those skilled in the art. The individual semiconductor chips are then packaged in a test packaging step 12 into test packages in a manner that will be described in more detail below. The packaging step may be performed by automated pick/place test apparatus for high speed testing.

Next, in a first test step 14, the packaged chips are tested. If the first test step indicates the chip is defective, it is removed from the package in a removal step 16. The defective chip is discarded, and the package is reused in the packaging step.

If the chip is not found to be defective, the chip is mounted in a permanent package in a permanent packaging step 18. The permanent packaging step can be done by removing the chip from the package and mounting the chip in a conventional package. Alternatively, the permanent packaging step can be performed by making the bond between the chip and the test package permanent, in a manner that will be described below.

The packaged chip is then tested in a second test step 20. If the chip is not found to be defective in the second test step, it can be shipped, or subjected to "burn-in" and further testing. If the chip is found to be defective in the second test step, the packaged chip is discarded.

Figure 2:
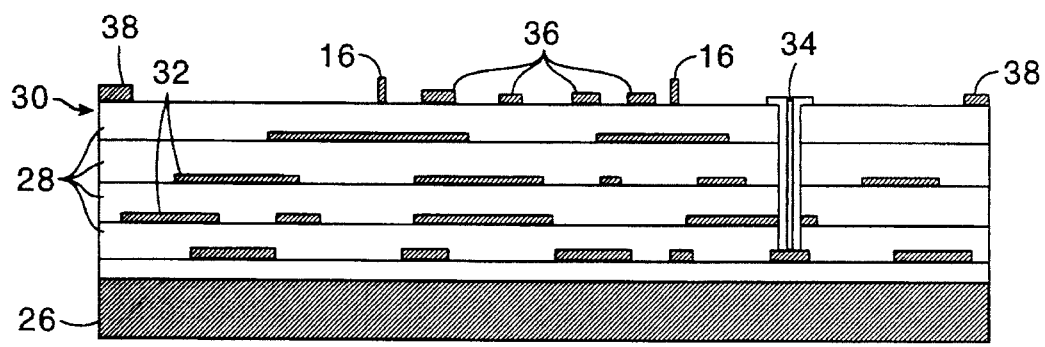
FIG. 2 is a cross section of an interconnect substrate used in the test package and the chip package.

FIG. 2 shows a part of the semiconductor package used in the packaging step 12 of FIG. 1. A flexible substrate 30 is either fabricated on a baseplate 26 or laminated to a baseplate 26, resulting in the assembly of FIG. 2. One suitable method for formation of the substrate is the method described in U.S. Pat. No. 4,812,191, issued Mar. 14, 1989, to Ho, et al. The baseplate 26 may be molybdenum, or another suitable rigid material, such as aluminum. In the process described in the above referenced U.S. Patent, the flexible substrate 30 consists of a plurality of layers 28 of polyimide, on which circuitry 32 has been formed. Portions of the circuitry on different layers may be connected by plated vias 34. Alignment templates 16 may be placed on the flexible substrate 30 by suitable means, such as photolithography. Included in the circuitry are connecting pads 36, which provide an interconnect point for a semiconductor device, and package interconnect pads 38, which provide interconnect points for a semiconductor package. Package interconnect pads may be connected to a package frame, such as a pin grid array, by wire bonding or some other suitable method.

Figure 3:
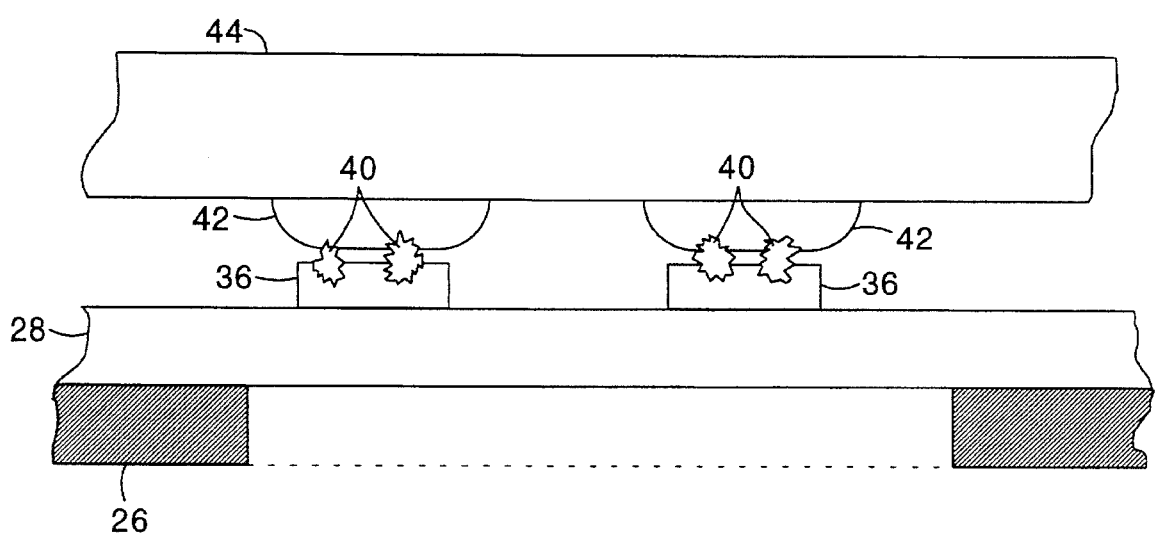
FIG. 3 is a cross section of the assembly of FIG. 2, with a portion of the baseplate section of the chip package removed.

Next, a portion of the baseplate 26 may be removed for example by selective etching, resulting in the apparatus shown in FIG. 3. The connecting pads 36 have been impregnated with particles 40 that enable the pads 42 of a semiconductor device 44 to be attached to the connecting pads by a process such as that described in the DiFrancesco patents. When pressure is applied to make the bonds as described in the DiFrancesco processes, the unsupported portion of the polyimide layers 28 can deflect downward, which allows for differences in height of the package interconnect pads and for slight non-planarity of top of the multilayer substrate.

Figure 4:
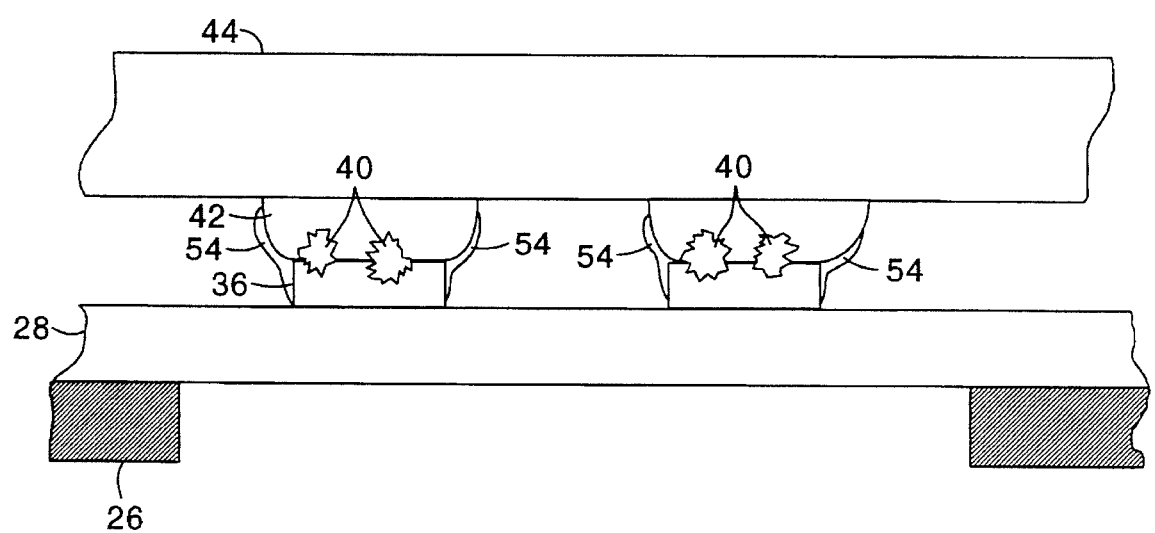
FIG. 4 is a cross section of the assembly of FIG. 2, after additional processing.

FIG. 4 shows the assembly of FIG. 2, after the permanent attachment step 18 of FIG. 1. The bond between the pads of the semiconductor device and the connecting pads has been made permanent by the application of additional pressure and, optionally heat, to the bond site. A sealant 54, such as a viscous oil prevents gases from reaching the bond site and causing oxidation at the bond site.

Although the foregoing has described preferred embodiments of the invention, it will be appreciated by those skilled in the art that changes in these embodiments may be made without departing from the principles of the invention, the scope of which is defined in the appended claims.

We claim:

1. A method of testing a semiconductor device having electrical contacts, comprising the steps of:

forming a semiconductor device test package, the package forming step including the steps of:

placing a layer of a flexible electrical insulator having in it electronic circuitry on a rigid substantially planar substrate, removing a portion of the substrate, such that a portion of the flexible insulator layer lies above the removed portion of said rigid substrate;

forming interconnect pads to match locations of said electrical contacts; comprising providing metalized particles protruding from said interconnect pads on a surface of the layer lying above the removed portion of the rigid substrate;

placing the semiconductor device on the semiconductor device test package so that the electrical contacts contact the interconnect pads; and urging the semiconductor device toward the interconnect pads to cause the metallized particles to pierce surfaces of said electrical contacts, controlling the urging force to be sufficient to cause the flexible electrical insulator to deflect to increase uniformity of the depth to which the metallized particles pierce the surface of the electrical contacts for test purposes.

2. The method of testing a semiconductor device having electrical contacts as claimed in claim 1, further comprising the steps of testing the semiconductor device to determine if the semiconductor device performs according to specifications.

3. The method of testing a semiconductor device having electrical contacts as claimed in claim 2, further comprising the step of in response to a determination that the semiconductor device performs according to specifications, further urging the electrical contacts toward the interconnect pads, to increase the penetration of the metallized particles into the electrical contacts.

4. The method of testing a semiconductor device as claimed in claim 2, further comprising the step of sealing an interface between the electrical contacts and the interconnect pads with a passivation agent.

5. The method of testing a semiconductor device having electrical contacts as claimed in claim 2, further comprising the steps of:

removing the semiconductor device from the semiconductor device test package; and in response to a determination that the semiconductor device performs according to specifications, mounting the semiconductor device in an operational package.

6. The method of testing a semiconductor device having electrical contacts as claimed in claim 1, the package forming step further including forming on the surface of the layer an alignment template for aligning the interconnect pads with the electrical contacts.

7. The method of testing a semiconductor device having electrical contacts as claimed in claim 6, further comprising the step of:

testing the semiconductor device to determine if the semiconductor device performs according to specifications.

8. The method of testing a semiconductor device having electrical contacts as claimed in claim 7, further comprising the step of:

in response to a determination that the semiconductor device performs according to specifications, further urging the electrical contacts toward the interconnect pads, to increase the penetration of the metallized particles into the electrical contacts.

9. The method of testing a semiconductor device as claimed in claim 8, further comprising the step of sealing an interface between the electrical contacts and the interconnect pads with a passivation agent.

10. The method of testing a semiconductor device as claimed in claim 1, wherein the step of removing a portion of the substrate comprises selectively etching a portion of the rigid substrate lying beneath the interconnect pads.

11. The method of testing a semiconductor device having electrical contacts as claimed in claim 10, further comprising the steps of:

testing the semiconductor device to determine if the semiconductor device performs according to specifications; and in response to determination that the semiconductor device performs according to specifications, further urging the electrical contacts toward the interconnect pads, to increase the penetration of the metallized particles into the electrical contacts.

12. The method of testing a semiconductor device as claimed in claim 11, further comprising the step of sealing an interface between the electrical contacts and the interconnect pads with a passivation agent.

\* \* \* \* \*